(12) United States Patent
Dickey

(10) Patent No.: US 11,095,113 B2
(45) Date of Patent: Aug. 17, 2021

(54) SYSTEMS AND METHODS FOR LIGHTNING PROTECTION IN POWER DISTRIBUTION MODULES

(71) Applicant: Hamilton Sundstrand Corporation, Charlotte, NC (US)

(72) Inventor: John A. Dickey, Caledonia, IL (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 178 days.

(21) Appl. No.: 16/221,035

(22) Filed: Dec. 14, 2018

(65) Prior Publication Data
US 2020/0194993 A1    Jun. 18, 2020

(51) Int. Cl.
| | |
|---|---|
| H02H 1/04 | (2006.01) |
| H02H 3/22 | (2006.01) |
| H02H 3/08 | (2006.01) |
| B60L 1/00 | (2006.01) |
| H02H 3/20 | (2006.01) |
| H01H 35/00 | (2006.01) |
| H02H 9/00 | (2006.01) |
| H02H 9/02 | (2006.01) |

(52) U.S. Cl.
CPC .............. H02H 3/22 (2013.01); H02H 1/04 (2013.01); H02H 3/08 (2013.01); B60L 1/00 (2013.01); H01H 35/00 (2013.01); H02H 3/20 (2013.01); H02H 9/00 (2013.01); H02H 9/02 (2013.01)

(58) Field of Classification Search
CPC .. H02H 3/22; H02H 1/04; H02H 3/08; H02H 9/02; H02H 3/20; H02H 9/00; B60L 1/00; H01H 35/00

USPC .................................. 361/86–87, 93.7–93.9
See application file for complete search history.

(56) References Cited

U.S. PATENT DOCUMENTS

| | | |
|---|---|---|
| 7,626,797 B2 | 12/2009 | Kilroy et al. |
| 7,656,634 B2 | 2/2010 | Robertson et al. |
| (Continued) | | |

FOREIGN PATENT DOCUMENTS

| | | |
|---|---|---|
| CA | 2599079 C | 4/2013 |
| EP | 2757688 A1 | 7/2014 |

OTHER PUBLICATIONS

Extended European Search Report dated May 12, 2020, issued during the prosecution of European Patent Application No. EP 19215131.4.

*Primary Examiner* — Danny Nguyen
(74) *Attorney, Agent, or Firm* — Locke Lord LLP; Scott D. Wofsy; Alicia J. Carroll

(57) ABSTRACT

A power distribution system includes a solid state power controller (SSPC). The SSPC includes a microcontroller having at least one voltage sense input. The microcontroller is configured to selectively allow a current through the SSPC in response to a common mode voltage to ground and/or a SSPC differential voltage meeting or exceeding a respective pre-determined threshold. A method of operating a SSPC includes determining whether at least one of a common mode voltage to ground or a SSPC differential voltage meet or exceed a respective pre-determined threshold. The method includes selectively allowing a current through the SSPC in response to at least one of the common mode voltage to ground or the SSPC differential voltage meeting or exceeding the respective pre-determined threshold.

20 Claims, 3 Drawing Sheets

(56) References Cited

U.S. PATENT DOCUMENTS

| | | | |
|---|---|---|---|
| 7,808,219 B2 * | 10/2010 | Ye | H02M 7/2176 |
| | | | 323/224 |
| 8,547,675 B2 | 10/2013 | Maier | |
| 9,197,056 B2 | 11/2015 | Liu et al. | |
| 9,590,412 B2 | 3/2017 | Poulose et al. | |
| 9,673,618 B2 | 6/2017 | Dickey | |
| 2008/0129113 A1 | 6/2008 | Robertson et al. | |
| 2013/0329329 A1 * | 12/2013 | Liu | H02H 3/18 |
| | | | 361/93.1 |
| 2016/0197465 A1 * | 7/2016 | Poulose | H02H 1/0069 |
| | | | 361/91.5 |
| 2018/0375505 A1 * | 12/2018 | Handy | H03K 17/16 |

\* cited by examiner

SYSTEMS AND METHODS FOR LIGHTNING PROTECTION IN POWER DISTRIBUTION MODULES

BACKGROUND OF THE DISCLOSURE

1. Field of the Disclosure

The present disclosure relates to power distribution modules and more particularly to solid state power controls for vehicles.

2. Description of Related Art

Vehicle power systems, such as those in aircraft, typically include at least one power distribution module for distributing power. The power distribution module typically includes at least one solid state power controller that includes a power switch, e.g. such as a metal-oxide-semiconductor field-effect transistor (MOSFET), and electronic circuitry that provides wiring protection. Together, the field effect transistor (FET), e.g. a MOSFET, and circuitry are referred to as a Solid State Power Controller (SSPC). SSPCs can be used instead of conventional electro-mechanical relays and circuit breakers for power distribution in a number of different applications. Some SSPC power distribution modules are widely used in aircraft secondary distribution systems. Hundreds or thousands of SSPCs are typically included in a power distribution module.

Lightning can adversely affect SSPCs and other electronic devices by causing power surges. As such, SSPCs also typically include lightning protection mechanisms that allow the SSPCs operate in the presence of lightning. One such mechanism includes Zener diodes connected to the FET gate. When the FET is in the OFF state and the line voltage exceeds the breakdown voltage of the protection Zener diodes that are connected to the FET gate, the Zener diodes are triggered. Once triggered, the newly developed gate voltage starts to turn on the FET thus reducing the drop across the drain/source connections and the FET then operates in the linear mode conducting high current with high voltage across it until the surge passes. Other mechanisms to mitigate adverse effects of lightning current include trip mechanisms that allow SSPCs to turn on during high level lightning strikes based on whether the current meets or exceeds the trip threshold, as described in U.S. patent application Ser. No. 11/606,795 entitled "Increasing the System Stability and Lightning Capability in a Power Distribution System that Utilizes Solid-State Power Controllers", now U.S. Pat. No. 7,626,797, which is incorporated herein by reference.

Such conventional methods and systems have generally been considered satisfactory for their intended purpose. However, there is still a need in the art for improved lightning protection.

SUMMARY

A power distribution system includes a solid state power controller (SSPC). The SSPC includes a microcontroller having at least one voltage sense input. The microcontroller is configured to selectively allow a current through the SSPC in response to a common mode voltage to ground and/or a SSPC differential voltage meeting or exceeding a respective pre-determined threshold.

The SSPC can include a gate drive and at least one Zener diode electrically connected to the gate drive. The SSPC can include a gate resistor in series between the gate drive and the at least one Zener diode. The SSPC can include a field effect transistor (FET) and at least one Zener diode electrically connected to the FET. The SSPC can include a gate voltage sense line in electrical communication with the FET and the at least one Zener diode. The SSPC can include a sense module. The gate voltage sense line can electrically connect the sense module to at least one of the FET or the at least one Zener diode. The gate voltage sense line can be configured to transmit a voltage signal to the sense module. The sense module can be configured to convert the voltage signal to a logic signal output to the at least one voltage sense input of the microcontroller. The sense module can be in electrical communication between the microcontroller and the gate voltage sense line to receive a SSPC differential voltage signal from the gate voltage sense line and convert it to a logic signal output to the at least one voltage sense input of the microcontroller. The power distribution system can include a SSPC communications interface operatively connected to the SSPC. The SSPC communications interface can be configured to transmit data to and from a plurality of other SSPC. The SSPC can include an instantaneous trip module.

In accordance with another aspect, a method of operating a solid state power controller (SSPC) includes determining whether at least one of a common mode voltage to ground or a SSPC differential voltage meet or exceed a respective pre-determined threshold. The method includes selectively allowing a current through the SSPC in response to at least one of the common mode voltage to ground or the SSPC differential voltage meeting or exceeding the respective pre-determined threshold.

The method can include determining whether the SSPC is commanded in an ON state or an OFF state. If the SSPC is in the ON state, the method can include determining the common mode voltage to ground. The common mode voltage to ground can be an average of a load output voltage of the SSPC and a line voltage of the SSPC. If the SSPC is in the OFF state, the method can include measuring a gate voltage of a field effect transistor (FET) of the SSPC. Determining whether the SSPC differential voltage meets or exceeds the respective pre-determined threshold can include determining whether the gate voltage meets or exceeds a gate voltage threshold. The method can include switching the SSPC to an ON state and allowing the current through the SSPC if the SSPC differential voltage meets or exceeds the respective pre-determined threshold.

The method can include starting a timing function if the common mode voltage to ground or the SSPC differential voltage meets or exceeds its respective pre-determined threshold. The method can include measuring a current after starting the timing function to determine if the current meets or exceeds a current threshold. The switching the SSPC to an OFF state and stopping current through the SSPC if the current is less than the current threshold. The method can include determining the common mode voltage to ground after the timing function to determine if the common mode voltage to ground is greater than a threshold voltage. The method can include switching the SSPC to an OFF state and stopping current through the SSPC if the common mode voltage to ground is less than the threshold voltage. The method can include switching the SSPC to an OFF state and stopping current through the SSPC if a duration of the timing function expires. A duration of the timing function from start to expiration can be twice as long as a lightning strike. The SSPC can be a first one of a plurality of SSPCs.

These and other features of the systems and methods of the subject disclosure will become more readily apparent to those skilled in the art from the following detailed description of the embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
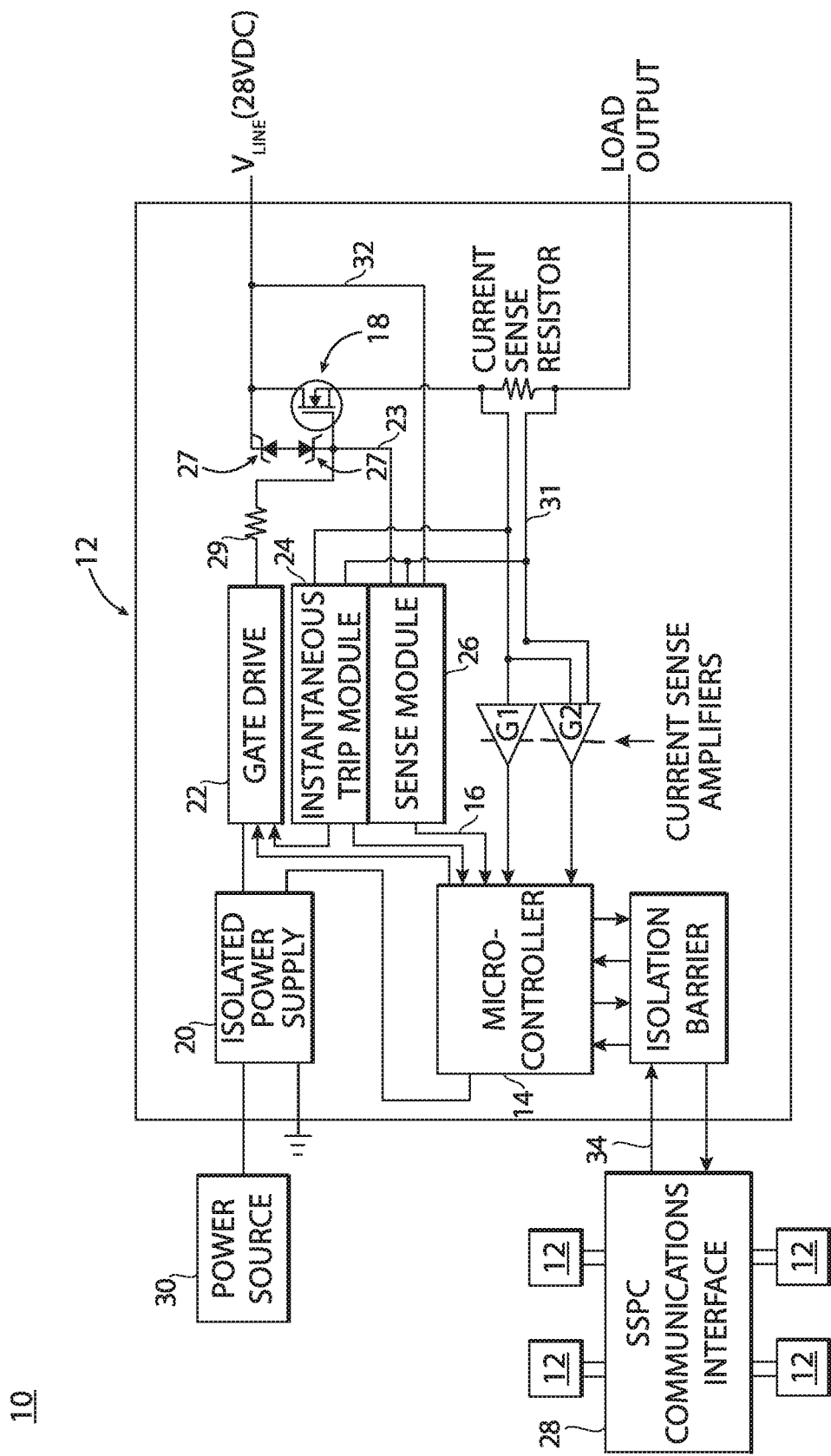
FIG. 1 is a block diagram schematically illustrating an embodiment of a power distribution system constructed in accordance with the present disclosure, showing a solid state power controller (SSPC)

Reference will now be made to the drawings wherein like reference numerals identify similar structural features or aspects of the subject disclosure. For purposes of explanation and illustration, and not limitation, a schematic depiction of an exemplary embodiment of a power distribution system with a solid state power controller (SSPC) constructed in accordance with the disclosure is shown in FIG. 1, and is designated generally by reference character 10. Other embodiments of power distribution systems in accordance with the disclosure, or aspects thereof, are provided in FIGS. 2-3, as will be described.

The systems and methods described herein can be used to improve detection of surge events, such as lightning strikes. Specifically, the systems and methods described herein provide for SSPCs and methods for operating SSPCs with lightning protection having quicker response time than traditional current-based lightning protection by monitoring SSPC voltage drop and SSPC voltage above ground. In particular, the systems and methods described herein allow for quick protection of the SSPC during the time that the FET is OFF, which occurs even before transient current starts to flow, e.g. at the onset of Zener diode conduction and before the current has reached an 'instant trip' threshold. By monitoring SSPC voltage drop and SSPC voltage above ground and using the measured voltage to determine the appropriate state for the SSPC (e.g. ON state or OFF state), the determination of whether or not to turn the SSPC on or off can be made quicker than traditional systems. Moreover, traditional systems where voltage measurements were taken only route voltages to the analog-digital converter and not to a digital interrupt. In other words, the voltages may have been sampled at a relatively low frequency, and detected too late to act. In a lightning strike situation, a faster determination and turning ON (if warranted) reduces the energy (heat) dissipated by the SSPC, which in turn provides for increased reliability and allows for fewer parallel field effect transistors (FETs) to be used.

Overall, this reduces costs and board space for each SSPC.

As shown in FIG. 1, a power distribution system 10, e.g. a power distribution system for a vehicle, includes a SSPC 12 for use in a vehicle, such as an aircraft. Those skilled in the art will readily appreciate that the systems and method described herein can readily be utilized for ground-based applications in industry or homes. The SSPC 12 includes a microcontroller 14 with at least one voltage sense input 16, e.g. a digital interrupt pin 16. The SSPC 12 also includes a field effect transistor (FET) 18 operatively connected to the microcontroller 14. In general, SSPC 12 is selectively controlled by commands from a SSPC communications interface 28 depending on whether it is desired to have power applied to the load. For the purposes of this discussion a single FET 18 is shown, while in practice it is common to have multiple FETs in parallel. The microcontroller 14 is configured to selectively allow, e.g. turn on/off, keep on/off, a current through the SSPC 12 in response to a common mode voltage to ground and/or a SSPC differential voltage meeting or exceeding their respective pre-determined thresholds by opening or closing the FET 18 during a lightning event. While the SSPC 12 is depicted herein as a single module, it is also contemplated that the SSPC 12 can include separate logic section and a power section.

With continued reference to FIG. 1, SSPC 12 includes an isolated power supply 20, which channels control power from a power source 30 to microcontroller 14 and a gate drive 22. The microcontroller 14 controls gate drive 22, which opens and closes FET 18 (e.g. a switch). Zener diodes 27 are electrically connected to the gate drive 22. SSPC 12 includes a series gate resistor 29 between gate drive 22 and the junction of gate drive 22 and Zener diodes 27. That same node is in electrical communication with a sense module 26 by way of gate voltage sense line 23. The gate voltage sense line 23 is configured to transmit a voltage signal indicative of the gate voltage to the sense module 26. The sense module 26 is in electrical communication between the microcontroller 14 and the gate voltage sense line 23 to receive the voltage signal from the gate voltage sense line 23 and convert it to a logic signal output to the at least one voltage sense input 16 of the microcontroller 14. If the gate voltage sensed from sense line 23 meets or exceeds a gate voltage threshold, that indicates that the Zener diodes are conducting and that the SSPC differential voltage is greater or equal to a pre-determined differential threshold. The gate voltage threshold is set above a negligible amount, e.g. more than noise or leakage current, such as 1 volt or greater. Sense module 26 includes signal conditioning circuitry that converts the voltage signal to the logic signal output. The SSPC differential voltage is the difference between the load voltage and the line voltage.

With continued reference to FIG. 1, SSPC 12 also includes an instantaneous trip module 24, a sense module 26, and a device, e.g. a current resistor sensor, for sensing the electrical current flow through the FET 18. A load voltage sense line 31 electrically connects the load output to the microcontroller 14 to obtain a load voltage ($V_LOA_D$). A line voltage sense line 32 is electrically connected to the sense module 26 (and in turn, operatively connected to the microcontroller 14) in order to obtain a line voltage ($W_{INE}$). As used throughout the present application, "common mode voltage to ground" is an average of the load voltage and the line voltage. When the SSPC is ON, this is equivalent to VLOAD, as the potential across the SSPC is negligible when the SSPC is ON.

As shown in FIG. 1, instantaneous trip module 24 acts as a comparator, and determines when current meets or exceeds an instantaneous trip threshold. The SSPC communications interface 28 communicates with other SSPCs 12. The FET 18 can handle more transient current, e.g. current from a lightning strike, when ON (e.g. closed) because the voltage across the FET 18 will be lower, thus reducing the transient energy that the FET 18 must absorb. The transient current flows to the load output during this time to thereby protect the SSPC 12 from damage. In order to know when to turn the SSPC on or off (or keep it on) in response to a lightning strike, the microcontroller 14 is configured to determine whether a common mode voltage to ground meets or exceeds a pre-determined common mode threshold and/or whether a SSPC differential voltage meets or exceeds a pre-determined differential threshold, as described in more detail below. In sum, when the SSPC is ON a common mode voltage to ground is measured to confirm whether or not a surge (e.g. a lightning strike) has occurred. If a strike has occurred, the instant trip function is ignored. When the SSPC is OFF a gate voltage is measured to determine if the SSPC is being driven on by drain voltage.

Figure 2:
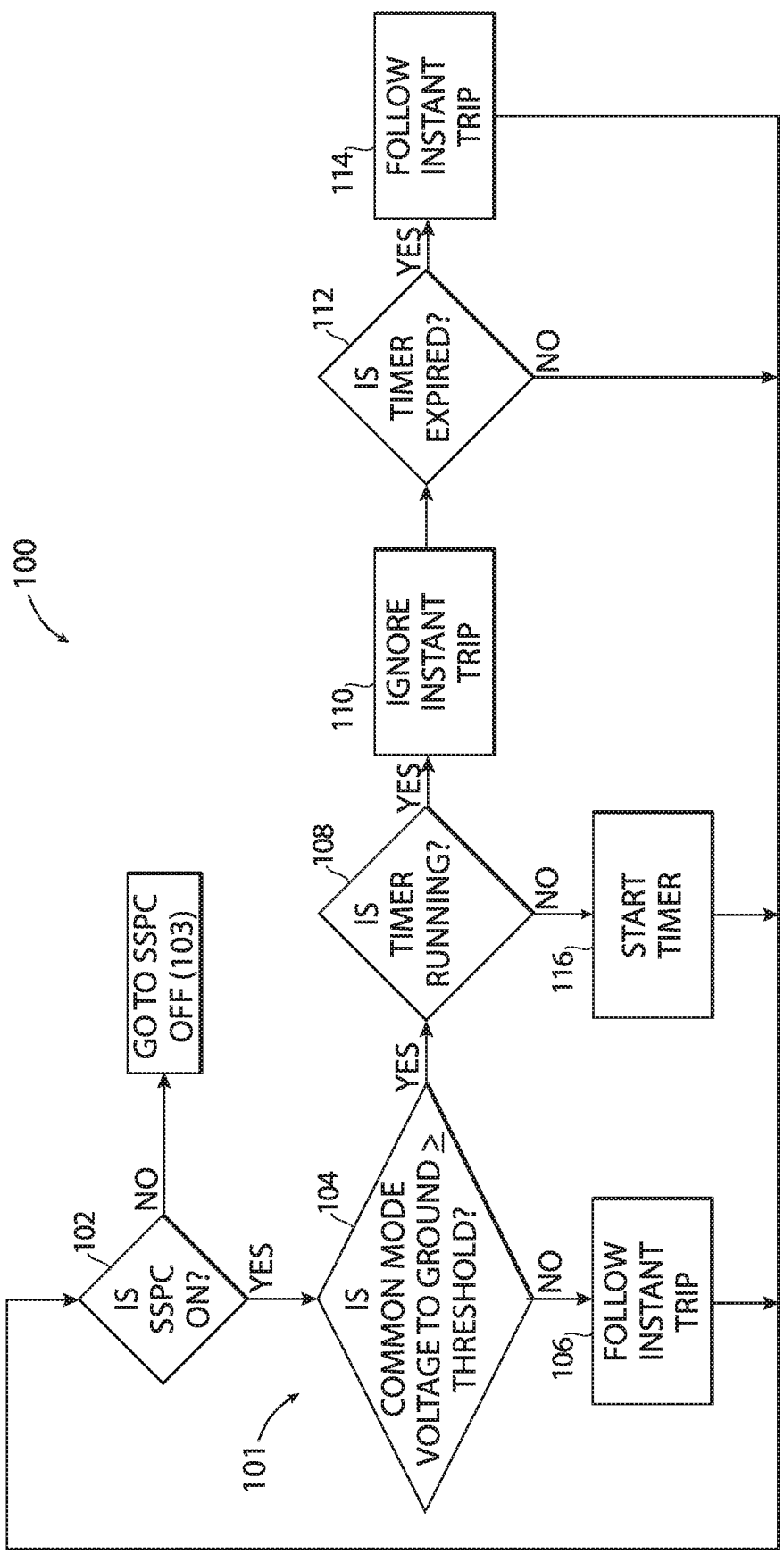
FIG. 2 is a flow chart schematically depicting an embodiment of method of operating a SSPC in accordance with the present disclosure.

As shown in FIG. 2, a method 100 of operating a SSPC, e.g. SSPC includes determining whether a SSPC, e.g. the SSPC 12, is commanded in an ON state or an OFF state, as indicated schematically by box 102. If the SSPC is in the ON state, the operations shown in FIG. 2 and designated generically as 101 are performed. If the SSPC is OFF, e.g. in the OFF state, the operations shown in FIG. 3 and designated generically as 103 are performed. If the SSPC is in the ON state, method 100 includes determining the common mode voltage to ground and whether the common mode voltage to ground meets or exceeds a pre-determined common mode threshold, indicated schematically by box 104. When the SSPC is in the ON state and a lightning strike hits, the output current will change substantially (more positive or more negative depending on the lightning relative polarity) and the SSPC common mode voltage to ground will change substantially. The common mode voltage to ground is determined by averaging the measured $V_{LINE}$ and VLOAD. This parameter is an indication that the SSPC should remain in the ON state through the lightning strike, thereby allowing current through the SSPC minimizing the energy dissipation in the SSPC. If the common mode voltage to ground meets or exceeds a pre-determined common mode threshold, the method includes determining whether a timing function has already begun, which is indicated schematically by box 108. If the timing function has not begun, the method 100 includes starting the timing function, as indicated schematically by box 116, and then repeating the preceding operations in a loop, as schematically shown in FIG. 2.

If the timing function has already been started, the method includes ignoring an instant trip command, e.g. from instantaneous trip module 24, as indicated schematically by box 110. The instant trip in this case is ignored in order to ensure that the SSPC is kept in the ON state for either the duration of the timing function or until the common mode voltage to ground is below the pre-determined common mode threshold. Ultimately, if the common mode ground voltage drops before the current does then the SSPC will be subjected to the instant trip, described below. However, if the current follows the common mode voltage, the SSPC will remain in the ON state. The method includes determining whether the timing function has expired, as indicated schematically by box 112. If the timing function has expired, the method includes following the instant trip command, as indicated schematically by box 114, which may include switching the SSPC to an OFF state or keeping it in an ON state, depending on whether a current threshold is met. Those skilled in the art will readily appreciate that following the instant trip could mean following the method described in U.S. Pat. No. 7,626,797, which is incorporated herein by reference. Following the instant trip could mean that the SSPC remains in an ON state or is turned to an OFF state, depending on the current (or other trip parameter).

In accordance with some embodiments, the duration of the timing function from start to expiration is twice as long as a lightning strike, for example, and/or the duration is sufficiently timed to allow the lightning event to pass before returning to normal operation. The timing is a protective function in case the system 10 is compromised and constantly reading false positives indicating a lightning strike. In accordance with some embodiments, the duration of the timing function can range from 100-500 microseconds. If the common mode voltage to ground is less than the pre-determined common mode threshold, as determined by the operation schematically represented by box 104, the method includes following the instant trip command, which is indicated schematically by box 106, and is similar to the instant trip command represented by box 114.

Figure 3:
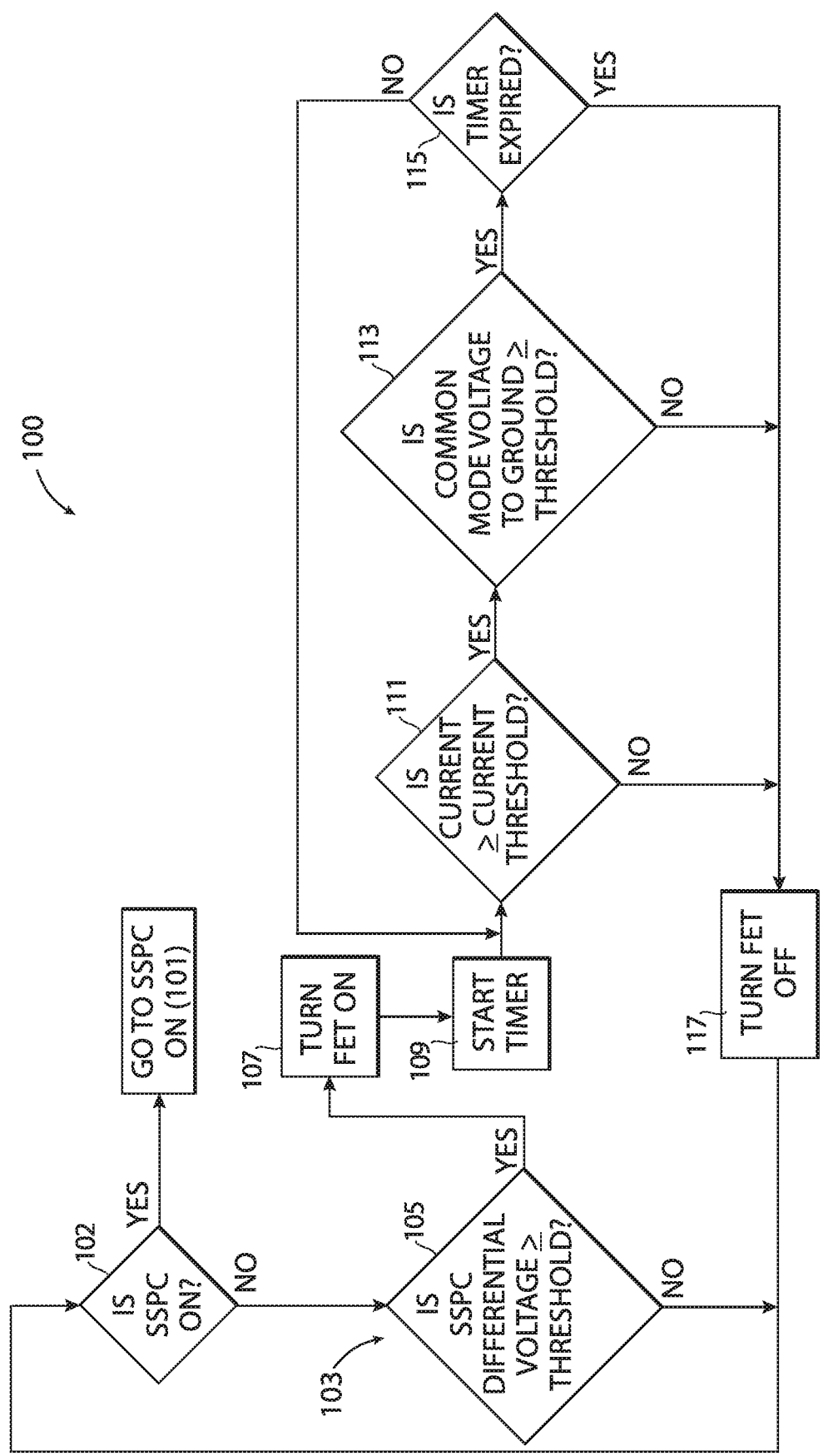
FIG. 3 is a flow chart schematically depicting another embodiment of method of operating a SSPC in accordance with the present disclosure.

As shown in FIG. 3, if the SSPC is in the OFF state (e.g. when the instant trip is off), the operations designated generically as 103 are performed. Whether or not the SSPC is ON or OFF is known inherently by the SSPC as it is told by the communication interface. With the SSPC in the OFF state at the onset of a lightning pulse, the SSPC will begin to conduct into the power Zener mode and, at the same time, a voltage signal indicative of a gate voltage will flow to a micro-controller, e.g. micro-controller 14, indicated schematically by a voltage sense input, e.g. a digital interrupt pin 16. Method 100 includes determining whether the SSPC differential voltage exceeds a pre-determined differential threshold by measuring a gate voltage, as indicated schematically by box 105. Determining whether the SSPC differential voltage exceeds a pre-determined voltage threshold is determined by whether or not the gate voltage sensed from a sense line, e.g. the sense line 23, is more than a negligible amount, e.g. more than noise or leakage current (e.g. 1 volt or greater). If the gate voltage is more than a negligible amount, that indicates that the Zener diodes are conducting and that the SSPC differential voltage is greater or equal to the pre-determined voltage threshold. The gate voltage measurement is enabled by a series gate resistor, e.g. resistor 29. This allows the SSPC to be OFF all the way up to the point where the SSPC would have to start conducting. If the SSPC differential voltage meets or exceeds a pre-determined voltage threshold, current is allowed through the SSPC by turning on a FET, e.g. FET 18, as indicated schematically by box 107, thereby immediately reducing the energy dissipation in the SSPC by allowing current through the SSPC. Determining whether the SSPC differential voltage exceeds a pre-determined differential voltage threshold by sensing the gate voltage tends to be quicker than separately determining the SSPC differential voltage by taking samples of $V_{LINE}$ and VLOAD. The pre-determined differential voltage threshold is set by the voltage at which Zener diodes 27 start to conduct to drive the gate drive 22 even though the gate drive 22 and FET are turned off. The method includes starting a timing function if the SSPC differential voltage meets or exceeds the pre-determined differential voltage threshold, as indicated schematically by box 109.

With continued reference to FIG. 3, once the timing function has started, there are at least three items that may alter the state of the SSPC, e.g. current level, voltage level or timer expiration. The method includes measuring a current after starting the timing function to determine if the current meets or exceeds a current threshold, as indicated schematically by box 111. Determining whether the current meets or exceeds the current threshold includes measuring an analog current value. The method includes switching the SSPC to an OFF state (e.g. turning off the FET by opening the FET) if the current is less than the current threshold, as indicated schematically by box 117. If the current meets or exceeds the current threshold, the method includes determining the common mode voltage to ground and determining whether the common mode voltage to ground meets or exceeds a threshold voltage, as indicated schematically by box 113. The method includes switching the SSPC to an OFF state (e.g. turning off the FET by opening the FET) if the common mode voltage to ground is less than or equal to the common mode threshold voltage, as indicated schematically by box 117. If the common mode voltage to ground meets or exceeds the common mode threshold voltage, then the method includes determining whether the timing function has expired, as indicated schematically by box 115.

As shown in FIG. 3, the method includes switching the SSPC to an OFF state if a duration of the timing function expires, as indicated schematically by box 117. If the timing function has not expired, the method includes looping back to one or more of the operations indicated by boxes 111, 113 or 115 at regular sample intervals to check and see if the conditions have changed. Any of these tests, e.g. those in boxes 111, 113 and 115, resulting in the opposite conditions will result in turning the output of the SSPC to the OFF state, as indicated by box 117. As noted above, the SSPC 12 is one of a plurality of SSPCs. Selectively allowing the current through one of the other SSPCs (e.g. turning it from an OFF state to an ON state, or vice a versa) is in response to the common mode voltage to ground and/or the SSPC voltage of the first SSPC meeting or exceeding their respective pre-determined thresholds. In other words, the results of the operations described above with reference to FIGS. 2 and 3 for a first SSPC can be used to control other SSPCs as well. Communication between the various SSPCs is effected by SSPC communications interface 28.

Embodiments of the present disclosure provide the benefit of more quickly identifying a current surge condition, such as a lightning strike, in order to more quickly pass the transient current on to the load to protect the SSPC 12 from damage. The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The methods and systems of the present disclosure, as described above and shown in the drawings provide for power control modules with superior properties including increased heat dissipation, more efficient manufacturing and capability to include more power devices in a module. While the apparatus and methods of the subject disclosure have been shown and described with reference to certain embodiments, those skilled in the art will readily appreciate that change and/or modifications may be made thereto without departing from the scope of the subject disclosure.

What is claimed is:

1. A power distribution system, comprising:
a solid state power controller (SSPC) including:
a microcontroller having at least one voltage sense input, wherein, when the SSPC is in an ON state, the microcontroller is configured to selectively allow a current through the SSPC in response to a common mode voltage to ground meeting or exceeding a pre-determined common mode threshold, and wherein, when the SSPC is in an OFF state, the microcontroller is configured to selectively allow a current through the SSPC in response to a SSPC differential voltage meeting or exceeding a pre-determined differential threshold.

2. The power distribution system of claim 1, wherein the SSPC includes a gate drive and at least one Zener diode electrically connected to the gate drive, wherein the SSPC includes a gate resistor in series between the gate drive and the at least one Zener diode.

3. A power distribution system, comprising:
a solid state power controller (SSPC) including:
a microcontroller having at least one voltage sense input, wherein the microcontroller is configured to selectively allow a current through the SSPC in response to at least one of a common mode voltage to ground or a SSPC differential voltage meeting or exceeding a respective pre-determined threshold;
a field effect transistor (FET) and at least one Zener diode electrically connected to the FET, wherein the SSPC includes a gate voltage sense line in electrical communication with the FET and the at least one Zener diode.

4. The power distribution system of claim 3, wherein the SSPC includes a sense module, wherein the gate voltage sense line electrically connects the sense module to at least one of the FET or the at least one Zener diode.

5. The power distribution system of claim 4, wherein the gate voltage sense line is configured to transmit a voltage signal to the sense module, and wherein the sense module is configured to convert the voltage signal to a logic signal output to the at least one voltage sense input of the microcontroller.

6. A power distribution system, comprising:
a solid state power controller (SSPC) including:
a microcontroller having at least one voltage sense input, wherein the microcontroller is configured to selectively allow a current through the SSPC in response to at least one of a common mode voltage to ground or a SSPC differential voltage meeting or exceeding a respective pre-determined threshold;
a gate voltage sense line and a sense module, wherein the sense module is in electrical communication between the microcontroller and the gate voltage sense line to receive a voltage signal from the gate voltage sense line and convert it to a logic signal output to the at least one voltage sense input of the microcontroller.

7. The power distribution system of claim 1, further comprising a SSPC communications interface operatively connected to the SSPC, wherein the SSPC communications interface is configured to transmit data to and from a plurality of other SSPC.

8. A method of operating a solid state power controller (SSPC), the method comprising:
   determining whether a common mode voltage to ground meets or exceeds a pre-determined common mode threshold or whether a SSPC differential voltage meets or exceeds a pre-determined differential threshold; and
   when the SSPC is in an ON state, selectively allowing a current through the SSPC in response the common mode voltage to ground meeting or exceeding the pre-determined common mode threshold or, when the SSPC is in an OFF state, selectively allowing a current through the SSPC in response to the SSPC differential voltage meeting or exceeding the pre-determined differential threshold.

9. The method as recited in claim 8, further comprising determining whether the SSPC is commanded in an ON state or an OFF state.

10. A method of operating a solid state power controller (SSPC), the method comprising:
   determining whether at least one of a common mode voltage to ground or a SSPC differential voltage meet or exceed a respective pre-determined threshold;
   selectively allowing a current through the SSPC in response to at least one of the common mode voltage to ground or the SSPC differential voltage meeting or exceeding the respective pre-determined threshold;
   determining whether the SSPC is commanded in an ON state or an OFF state; and
   determining the common mode voltage to ground if the SSPC is in the ON state.

11. The method as recited in claim 10, wherein the common mode voltage to ground is an average of a load output voltage of the SSPC and a line voltage of the SSPC.

12. A method of operating a solid state power controller (SSPC), the method comprising:
   determining whether at least one of a common mode voltage to ground or a SSPC differential voltage meet or exceed a respective pre-determined threshold;
   selectively allowing a current through the SSPC in response to at least one of the common mode voltage to ground or the SSPC differential voltage meeting or exceeding the respective pre-determined threshold;
   determining whether the SSPC is commanded in an ON state or an OFF state; and
   measuring a gate voltage of a field effect transistor (FET) of the SSPC if the SSPC is in the OFF state.

13. The method as recited in claim 12, wherein determining whether the SSPC differential voltage meets or exceeds the respective pre-determined threshold includes determining whether the gate voltage meets or exceeds a gate voltage threshold.

14. The method as recited in claim 8, further comprising switching the SSPC to an ON state and allowing the current through the SSPC if the SSPC differential voltage meets or exceeds the respective pre-determined threshold.

15. The method as recited in claim 8, further comprising starting a timing function if the common mode voltage to ground or the SSPC differential voltage meets or exceeds the respective pre-determined threshold.

16. The method as recited in claim 15, further comprising measuring a current after starting the timing function to determine if the current meets or exceeds a current threshold.

17. A method of operating a solid state power controller (SSPC), the method comprising:
   determining whether at least one of a common mode voltage to ground or a SSPC differential voltage meet or exceed a respective pre-determined threshold;
   selectively allowing a current through the SSPC in response to at least one of the common mode voltage to ground or the SSPC differential voltage meeting or exceeding the respective pre-determined threshold;
   starting a timing function if the common mode voltage to ground or the SSPC differential voltage meets or exceeds the respective pre-determined threshold;
   measuring a current after starting the timing function to determine if the current meets or exceeds a current threshold; and
   switching the SSPC to an OFF state and stopping the current through the SSPC if the current is less than the current threshold.

18. A method of operating a solid state power controller (SSPC), the method comprising:
   determining whether at least one of a common mode voltage to ground or a SSPC differential voltage meet or exceed a respective pre-determined threshold;
   selectively allowing a current through the SSPC in response to at least one of the common mode voltage to ground or the SSPC differential voltage meeting or exceeding the respective pre-determined threshold;
   starting a timing function if the common mode voltage to ground or the SSPC differential voltage meets or exceeds the respective pre-determined threshold; and
   determining the common mode voltage to ground after the timing function to determine if the common mode voltage to ground is greater than a threshold voltage.

19. The method as recited in claim 18, further comprising switching the SSPC to an OFF state and stopping the current through the SSPC if the common mode voltage to ground is less than the threshold voltage.

20. The method as recited in claim 15, further comprising switching the SSPC to an OFF state and stopping the current through the SSPC if a duration of the timing function expires.

* * * * *